United States Patent
Park et al.

(10) Patent No.: US 7,848,167 B2
(45) Date of Patent: Dec. 7, 2010

(54) APPARATUS AND METHOD FOR GENERATING WIDE-RANGE REGULATED SUPPLY VOLTAGES FOR A FLASH MEMORY

(75) Inventors: Soo-yong Park, Sunnyvale, CA (US); Boon-Aik Ang, Santa Clara, CA (US); Steve Choi, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 218 days.

(21) Appl. No.: 12/255,622

(22) Filed: Oct. 21, 2008

(65) Prior Publication Data

US 2010/0097876 A1     Apr. 22, 2010

(51) Int. Cl.
*G11C 7/02*  (2006.01)
*G11C 7/10*  (2006.01)
*G11C 7/06*  (2006.01)

(52) U.S. Cl. .............................. 365/210.1; 365/189.02; 365/189.07; 365/191

(58) Field of Classification Search ............ 365/189.02, 365/189.07, 210.1
See application file for complete search history.

(56) References Cited

U.S. PATENT DOCUMENTS

| 6,140,871 A * | 10/2000 | Taft ............................... 330/9 |
| 7,626,531 B2 * | 12/2009 | Bailey ........................ 341/156 |
| 2005/0162299 A1 * | 7/2005 | Mulder ....................... 341/156 |

* cited by examiner

*Primary Examiner*—Ly D Pham
(74) *Attorney, Agent, or Firm*—Frommer Lawrence & Haug LLP; Matthew M. Gaffney (57) ABSTRACT

A voltage regulator is provided. The voltage regulator provides an output voltage that is proportional to a digital multi-bit select signal. The voltage regulator includes a coarse voltage regulator and a fine voltage regulator. The coarse voltage regulator provides a coarse output voltage based on an output of a voltage divider selected based on the most significant bits of the select signal. The fine voltage regulator provides the output voltage from the coarse output voltage. The output of the fine voltage regulator is adjusted by adjusting the output of an adjustable current source that is provided to a resistor that is coupled between the output and one of the inputs of the fine voltage regulator.

10 Claims, 10 Drawing Sheets

APPARATUS AND METHOD FOR GENERATING WIDE-RANGE REGULATED SUPPLY VOLTAGES FOR A FLASH MEMORY

FIELD OF THE INVENTION

The invention is related to voltage regulators, and in particular, but not exclusively, to an apparatus and method of generating adjustable wide-range regulated supply voltages for a flash memory.

BACKGROUND OF THE INVENTION

Various types of electronic memory have been developed in recent years. Some exemplary memory types are electrically erasable programmable read only memory (EEPROM) and electrically programmable read only memory (EPROM). EEPROM is easily erasable but lacks density in storage capacity, where as EPROM is inexpensive and denser but is not easily erased. "Flash" EEPROM, or Flash memory, combines the advantages of these two memory types. This type of memory is used in many electronic products, from large electronics like cars, industrial control systems, and etc. to small portable electronics such as laptop computers, portable music players, cell phones, and etc.

Flash memory is generally constructed of many memory cells where a single bit is held within each memory cell. Yet a more recent technology known as MirrorBit™ Flash memory doubles the density of conventional Flash memory by storing two physically distinct bits on opposite sides of a memory cell. The reading or writing of a bit occurs independently of the bit on the opposite side of the cell. A memory cell is constructed of bit lines formed in a semiconductor substrate. A split oxide-nitride-oxide (ONO) dielectric layer formed over top of the substrate and bit lines. The nitride serves as the charge storage layer between two insulating layers. Word lines are then formed over top of the ONO layer perpendicular to the bit lines. Applying a voltage to the word line, acting as a control gate, along with an applied voltage to the bit line allows for the reading or writing of data from or to that location in the memory cell array.

BRIEF DESCRIPTION OF THE DRAWINGS

Non-limiting and non-exhaustive embodiments of the present invention are described with reference to the following drawings, in which.

DETAILED DESCRIPTION

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. Similarly, the phrase "in some embodiments," as used herein, when used multiple times, does not necessarily refer to the same embodiments, although it may. As used herein, the term "or" is an inclusive "or" operator, and is equivalent to the term "and/or," unless the context clearly dictates otherwise. The term "based, in part, on", "based, at least in part, on", or "based on" is not exclusive and allows for being based on additional factors not described, unless the context clearly dictates otherwise. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal. Where either a field effect transistor (FET) or a bipolar junction transistor (BJT) may be employed as an embodiment of a transistor, the scope of the words "gate", "drain", and "source" includes "base", "collector", and "emitter", respectively, and vice versa.

The term "memory cell" as used herein refers to a portion of a memory that is configured to store at least one logic level in a memory. A memory cell can be configured to store a bit or binary datum indicative of a logic level, such as a "0" or a "1." Alternatively, a memory cell can have one of three or more logic levels. In general, a memory cell is typically arrayed with other memory cells to store an amount of data spanning, for example, a Byte, a Kilobyte, Megabyte, Gigabyte, a Terabyte, and larger. Such arrayed memory cells can be arranged in any of a wide variety of volatile and nonvolatile memories, including ROM and RAM. Memory cells can be flash memory cells, such as single-bit, dual-bit, or multi-bit flash memory cells, or can be SRAM, DRAM, EPROM, or EEPROM memory cells.

Briefly stated, the invention is related to a voltage regulator that provides an output voltage that is proportional to a digital multi-bit select signal. The voltage regulator includes a coarse voltage regulator and a fine voltage regulator. The coarse voltage regulator provides a coarse output voltage based on an output of a voltage divider selected based on the most significant bits of the select signal. The fine voltage regulator provides the output voltage from the coarse output voltage. The output of the fine voltage regulator is adjusted by adjusting the output of an adjustable current source that is provided to a resistor that is coupled between the output and one of the inputs of the fine voltage regulator.

Figure 1:
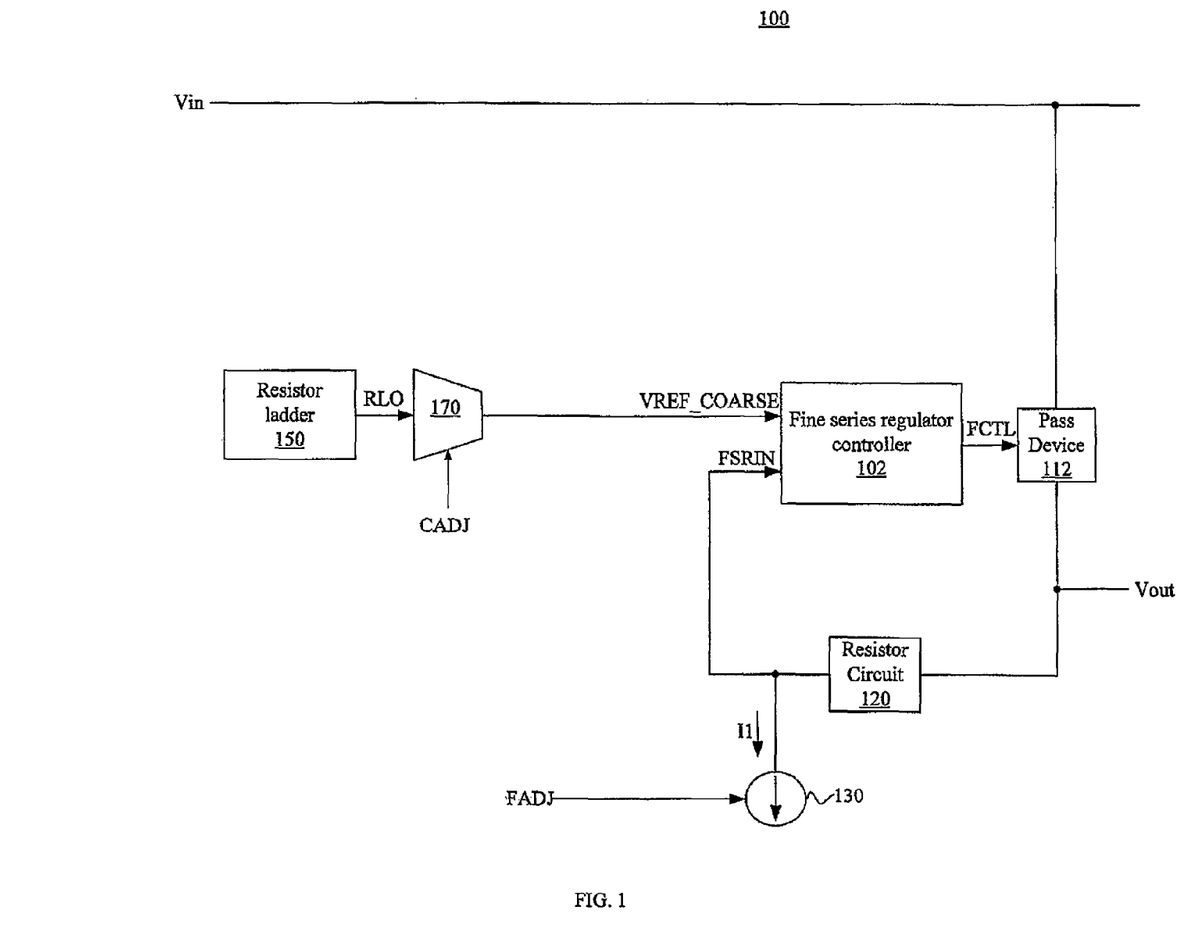
FIG. 1 illustrates a block diagram of an embodiment of a voltage regulator.

FIG. 1 illustrates a block diagram of an embodiment of voltage regulator 100 of FIG. 1. Voltage regulator 100 includes resistor ladder 150, multiplexer 170, fine series regulator controller 102, pass device 112, resistor circuit 120, and adjustable current source 130.

Resistor ladder 150 is arranged to provide resistor ladder output voltages RLO, which are several voltages evenly distributed between the top voltage and the bottom voltage of resistor ladder 150. For example, in one embodiment, coarse adjustment signal CADJ is a four-bit signal, and resistor ladder output voltages RLO includes sixteen voltages from resistor ladder 150. For example, in one embodiment, resistor ladder 150 provides sixteen voltages from level 1.14V to 9.5V with 16 steps with approximately 560 mV per step. Multiplexer 170 is arranged to provide coarse reference voltage VREF_COARSE by selecting one of the resistor ladder output voltages RLO based on signal coarse adjustment signal CADJ. For example, in one embodiment, coarse adjustment signal CADJ is four bits, resistor ladder 150 provides 16 voltages, and multiplexer 170 is a 16-to-1 multiplexer. However, the invention is not so limited, and in other embodiments, a different number of bits for coarse adjustment signal CADJ may be used with correspondingly different number of voltages provided by resistor ladder 150.

Fine series regulator controller 102 and pass device 112 operate together as a series regulator that converts input signal Vin into output voltage Vout such that output voltage Vout is regulated via series regulation (i.e., linear regulation that is not shunt regulation). Fine series regulator controller 102 is arranged to provide fine control signal FCTL to pass device 112. Pass device 112 is a series pass device, or the like. Coarse reference voltage VREF_COARSE is the reference voltage for the regulation of output voltage Vout such that output voltage Vout is regulated to be substantially the same as coarse reference voltage VREF_COARSE (or, in some embodiments, regulated to be a multiple of signal RES_COARSE, or the like), as further adjusted by resistor circuit 120 and adjustable current source 130.

Resistor circuit 120 provides an IR (voltage) drop between output voltage Vout and the feedback input of fine series regulator controller 102 to perform fine adjustment to the regulation of output voltage Vout, so that fine series regulator feedback signal FSRIN is provided to the feedback input of fine series regulator controller 102.

Resistor circuit 120 has a fixed resistance. Resistor circuit 120 may include a single resistor, or one or more resistors in series or in parallel to provide an equivalent resistance (or resistive device(s) that are similar to resistor(s) rather than actual resistor(s)). In one embodiment, resistor 120 is several resistors coupled in series with each other. The voltage across resistor circuit 120 is equal to the resistance of resistor circuit 120 times current I1. Adjustable current source 130 is arranged to provide current I1 such that current I1 is proportional to fine adjustment signal ADJ. In this way, signal RES_COARSE provides coarse adjustment to the regulated value of output voltage Vout, and fine adjustment signal ADJ provides fine adjustment to the regulated value of output voltage Vout.

In some embodiments, voltage regulator 100 may include many additional components not shown, including, in some embodiments, multiple fine regulators to generate multiple output voltages, each of which may be at a different voltage level.

Figure 2:
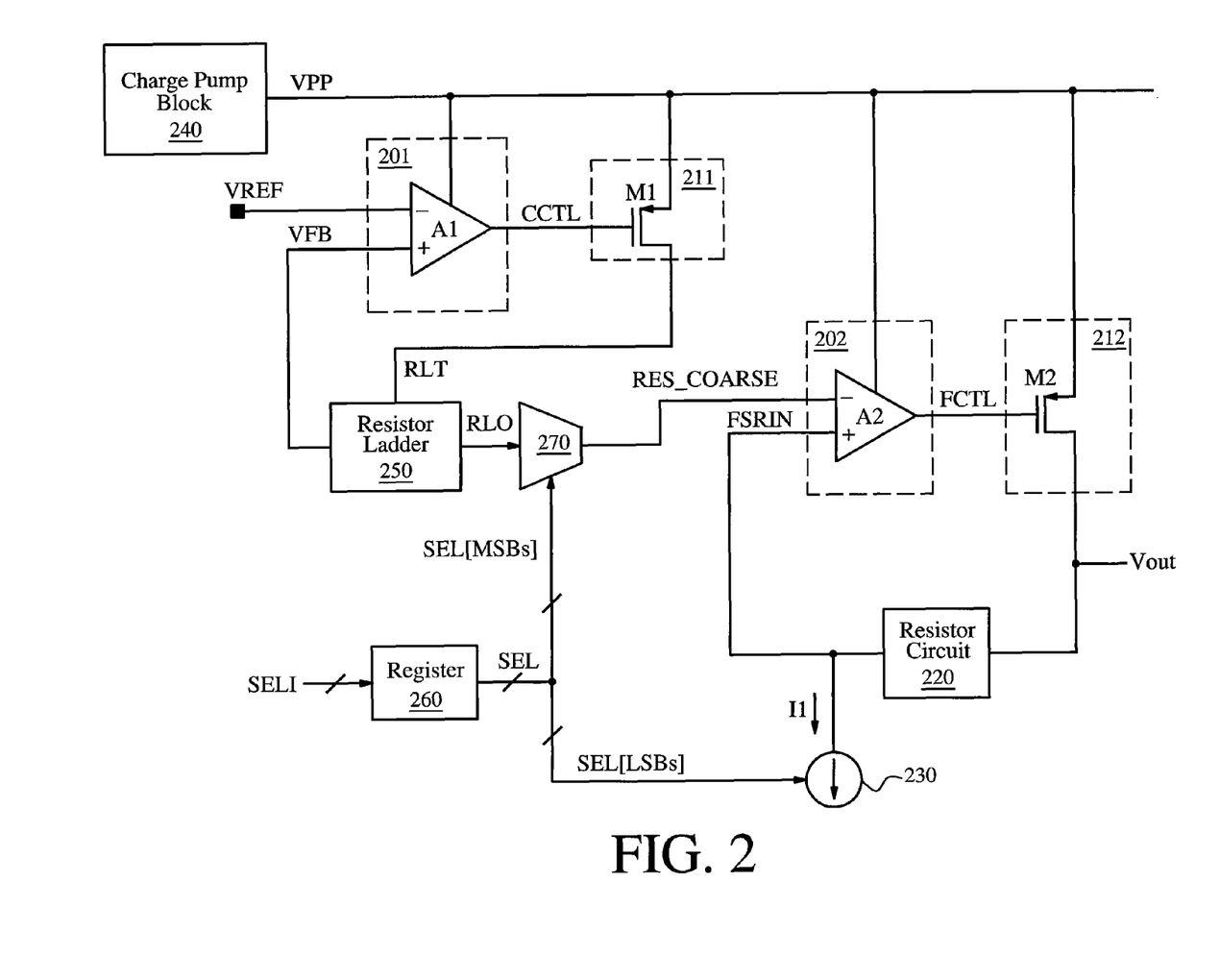
FIG. 2 shows a block diagram of an embodiment of the voltage regulator of FIG. 1.

FIG. 2 shows a block diagram of an embodiment of the voltage regulator 200, which may be employed as an embodiment of voltage regulator 100 of FIG. 1. Voltage regulator 200 further includes charge pump block 240, register 260, pass device 211, and coarse series regulator controller 201. Coarse series regulator controller 201 includes error amp A1. Similarly, fine series regulator controller 202 includes error amp A2. Further, pass device 211 includes transistor M1. Similarly, pass device 212 includes transistor M2.

Register 260 is arranged to receive select input signal SELI, and to provide selected signal SEL. Signal SELI and select signal SEL are each multi-bit digital signals. Signal SELI is used to initially set the value of select signal SEL, which is then stored in register 260. Signal SEL is divided into signal SEL[MSBs], which is the most significant bits of select signal SEL, and signal SEL[LSBs], which is the least significant bits of select signal SEL. For example, in one embodiment, signal SEL is an eight-bit signal (SEL[7:0]), SEL [MSBs] is SEL [7:4], and SEL[LSBs] is SEL[3:0]. In other embodiments, other numbers of bits may be used. Signal SEL[MSBs] is an embodiment of coarse adjustment signal CADJ of FIG. 1, and signal SEL[LSBs] is an embodiment of fine adjustment signal FADJ of FIG. 1.

Charge pump block 240 includes two or more charge pumps with their voltage outputs shorted together to provide voltage VPP. In one embodiment, charge pump block 240 includes eight charge pumps. Voltage VPP is an embodiment of input voltage Vin of FIG. 1.

Coarse series regulator controller 201 and pass device 211 operate together as a series regulator that converts input signal Vin into voltage RLT via series regulation (i.e. linear regulation that is not shunt regulation). Coarse regulator controller 201 is arranged to receive reference voltage VREF as a reference voltage for the voltage regulation. The feedback voltage VFB is the feedback voltage for the voltage regulation and is provided as one of the outputs of the resistor ladder 250. In one embodiment, voltage VREF is provided by a bandgap reference circuit (not shown). Coarse series regulator controller is arranged to provide coarse control signal CCTL to pass device 211. Pass device 211 is a series pass device, or the like. Signal RLT is the top voltage of the resistor ladder. For example, in one embodiment, VREF is a bandgap reference voltage of about 1.14 V, and resistor ladder 250 provides 16 voltages. The lowest output voltage provided by resistor ladder 250 is provided as the feedback voltage VFB, so that voltage VFB will follow voltage VREF as part of the negative feedback loop, so that VFB is equal to about 1.14V also. Accordingly, voltage RLT is regulated to about 9.6V. However, the invention is not so limited, and other voltage values may be employed in other embodiments.

Error amplifier A1 is arranged to provide coarse control signal CCTL from reference voltage VREF and feedback voltage VFB. Transistor M1 is arranged to operate as a series pass device. In one embodiment, transistors M1 and M2 are each a thick oxide 160A NOMOS transistor. Error amplifier A2 is arranged to provide fine control signal FCTT from coarse reference voltage VREF_COARSE and signal FSRIN. Voltage regulator 200 regulates output voltage Vout such that output voltage Vout is proportional to select signal SEL. In one embodiment, the coarse adjustment provides adjustment from 1.14V to 9.5V with 16 coarse steps of approximately 560 mV each, and the fine adjustment provides fine steps within each coarse step of about 35 mV per fine step. However, the invention is not so limited, and other voltage ranges and step sizes may be employed in other embodiments.

Figure 3:
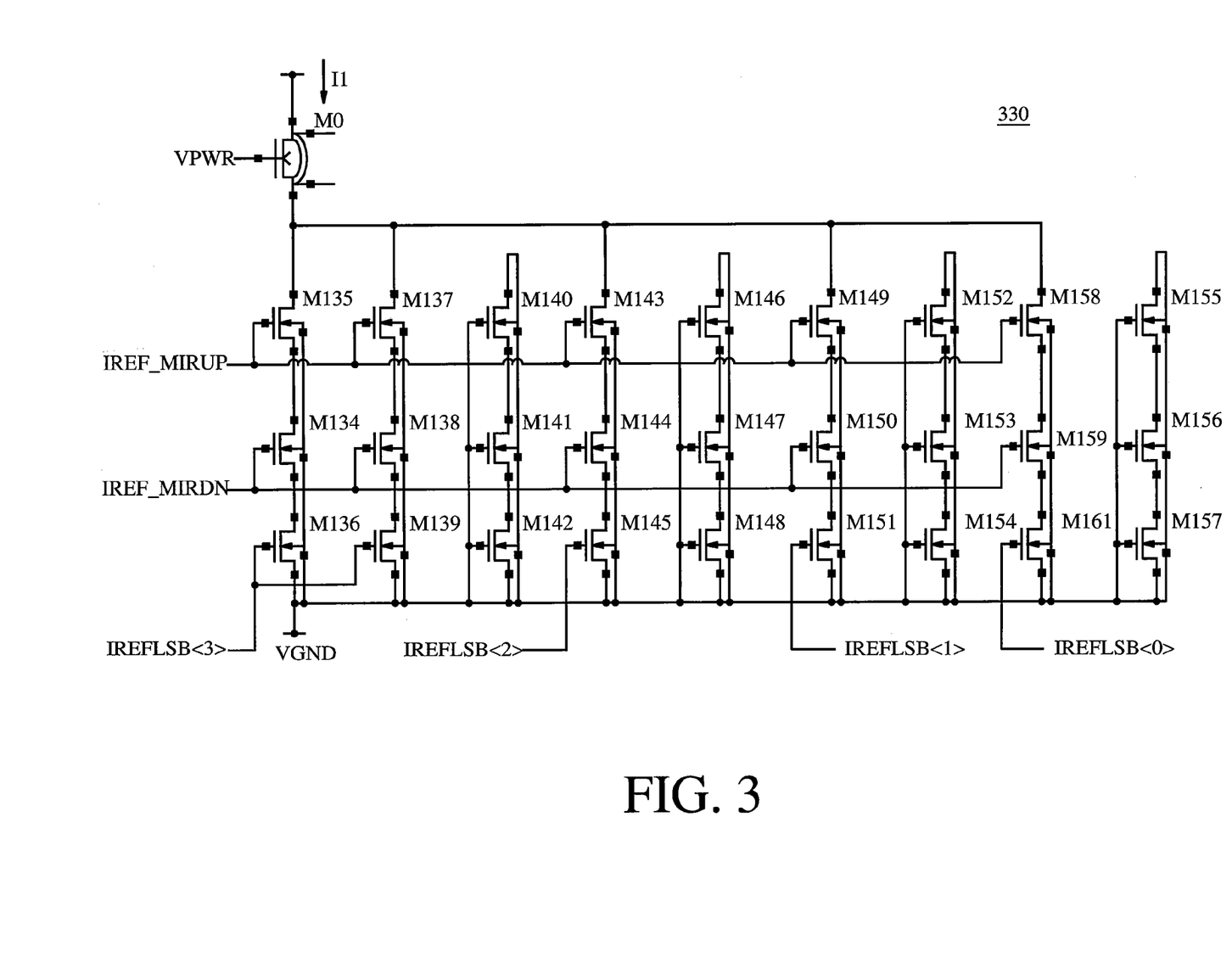
FIG. 3 schematically illustrates an embodiment of the adjustable current source of FIG. 2.

FIG. 3 schematically illustrates an embodiment of adjustable current source 330, which may be employed as an embodiment of FIG. 2. Adjustable current source 330 includes transistors M0 and M134-M161. The transistors in current source 330 are ratioed such that current I1 is proportional to SEL[3:0].

Figure 4:
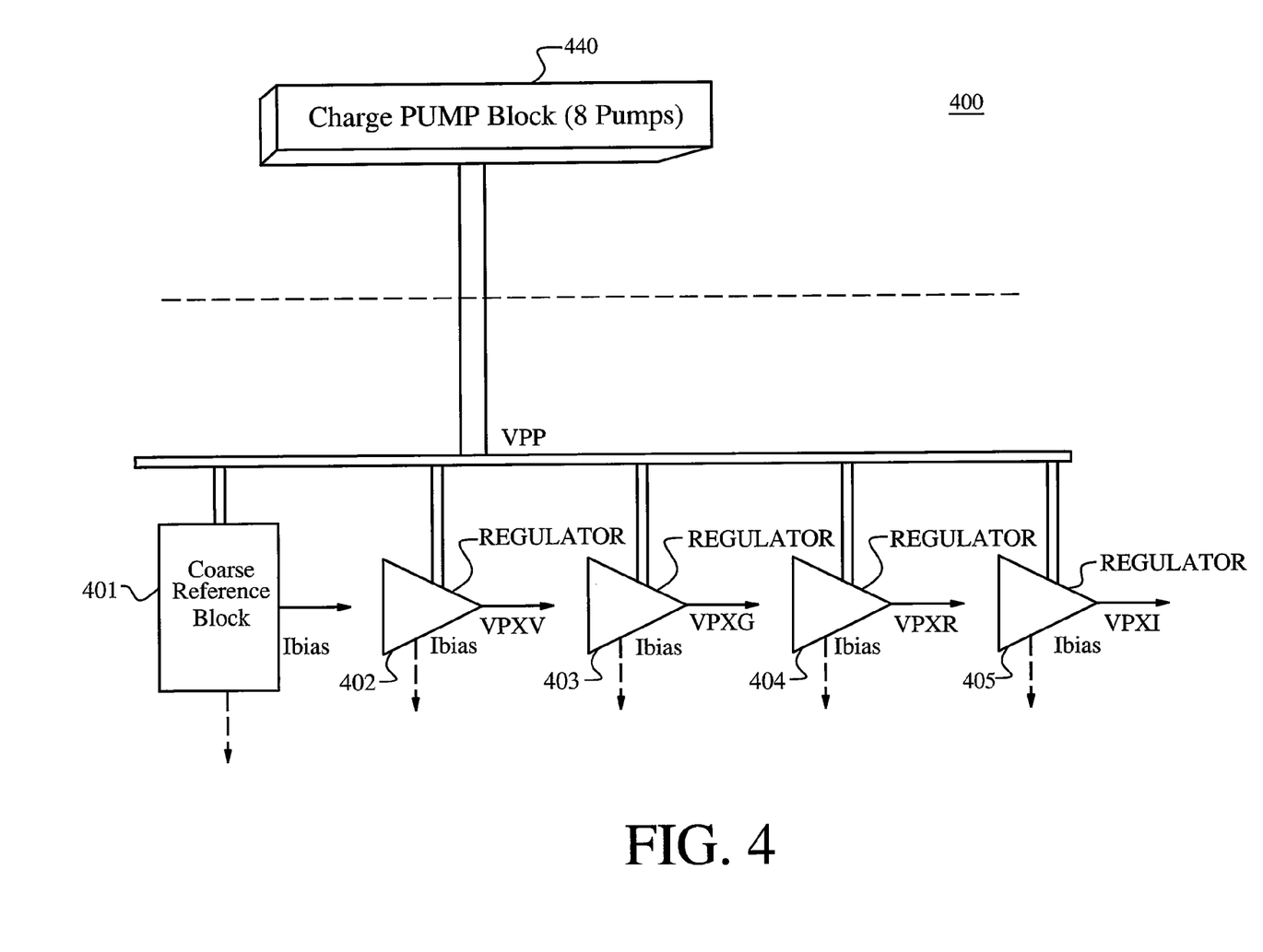
FIG. 4 shows a block diagram of an embodiment of the regulator of FIG. 1 that includes multiple voltage outputs.

FIG. 4 shows a block diagram of an embodiment of voltage regulator 400, which may be employed as an embodiment voltage regulator 100 of FIG. 1. Rather than only providing one voltage output, voltage regulator 400 provides multiple voltage outputs (e.g., VPXV, VPXG, VPXR, and VPXI). Fine regulators 402-405 are each a fine voltage regulator, each including a fine series regulator controller (e.g. fine series regulator controller 102) and a pass device (e.g. pass device 112) as shown in FIG. 1. Coarse reference block 401 provides one coarse reference voltage for each output voltage (e.g. having a separate multiplexer e.g. 150 of FIG. 1 providing a separate coarse reference voltage based on a separate coarse adjustment signal for each output voltage). Coarse reference block 401 and each of the fine regulators 402-405 receives a bias current Ibias. In one embodiment, bias current Ibias is about 65 µA of DC current. In one embodiment, charge pump block 440 includes eight charge pumps with their voltage outputs shorted together to provide voltage VPP. In other embodiments, a different number of charge pumps may be employed. In some embodiments, long and wide metal routing may be used for the VPP voltage path, such as 30 microns in width.

In one embodiment, voltage regulator 400 provides voltages VPXV, VPXG, VPXR, and VPXI, which are employed as supply voltages for a flash memory. Different components of a flash memory may require different supply voltages, which may be wide-ranging in the particular voltage levels required for each component. For example, in one embodiment, this enables a minimum 1.14V to maximum 10V range for the high voltage regulated word line for a flash memory. Also, in one embodiment, an additional voltage of less than 2.5V is used for built-in self test (BIST) mode. The architecture of FIG. 4 may be used to prevent the extra work ordinary required to match BIST mode and embedded mode to cover the full range of 1.5V to 10V.

Figure 5:
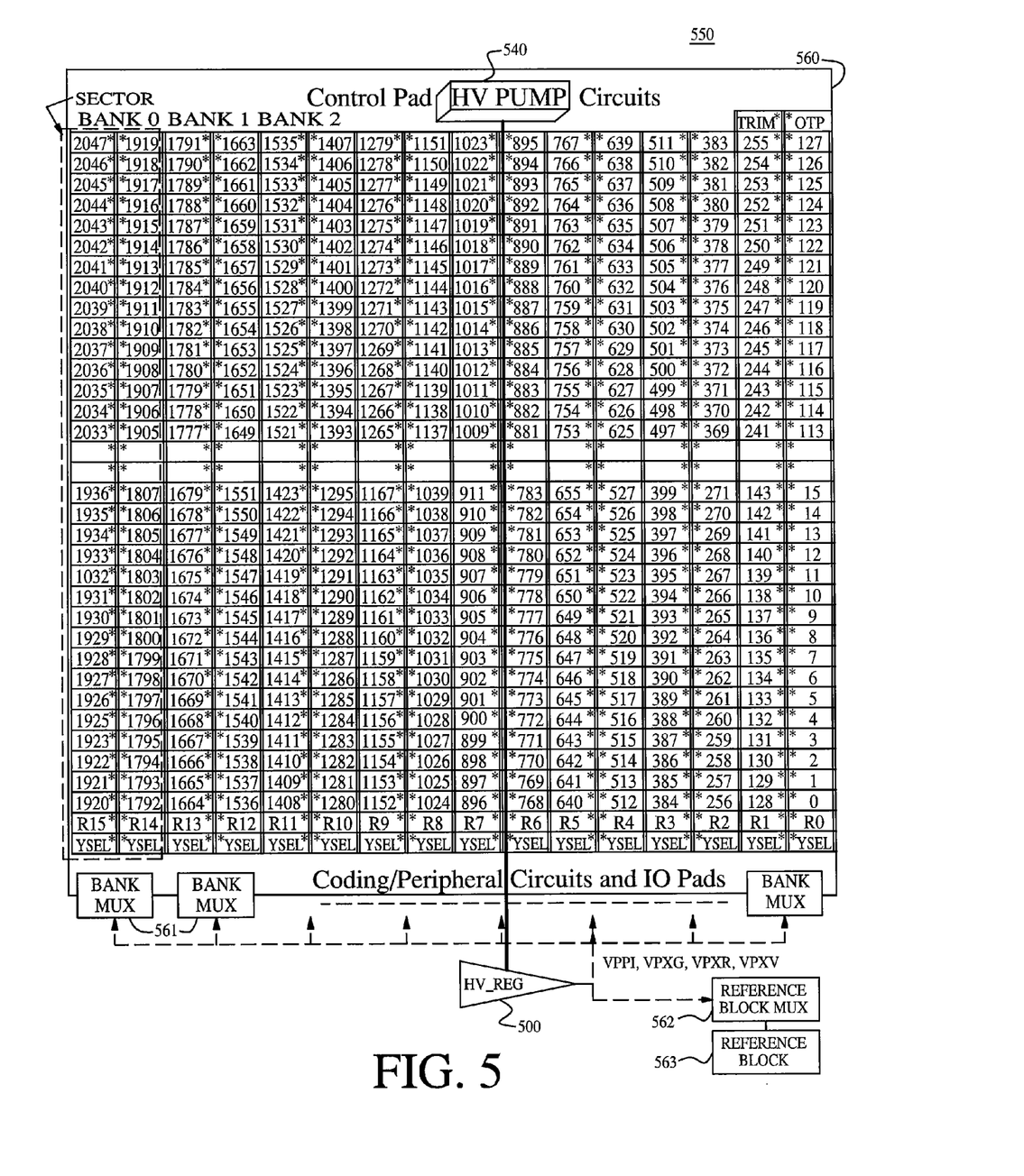
FIG. 5 illustrates a block diagram of an embodiment of a flash memory that includes an embodiment of the voltage regulator of FIG. 4.

FIG. 5 illustrates a block diagram of an embodiment of flash memory 550. Flash memory 550 includes charge pump block 540, core memory cells 560, bank multiplexers 561, reference block multiplexer 562, reference block 563, and voltage regulator 500, which is an embodiment of voltage regulator 400 of FIG. 4. Core memory cells 560 are arranged to store the data for flash memory 550.

Voltage regulator 500 is arranged to provide voltage VPPI, VPXG, VPXR, and VPXV. These regulated voltage are provided only to pre-selected locations defined by address. Bank multiplexers 561 are arranged to provide regulated voltages to those selected locations only. Similarly, reference block 562 provides supply voltages to reference block 563 only if reference block 563 requires them. Reference block 563 includes reference information used to determine, during a read operation, whether current from a core cell represents a 1 or 0.

Figure 6A:
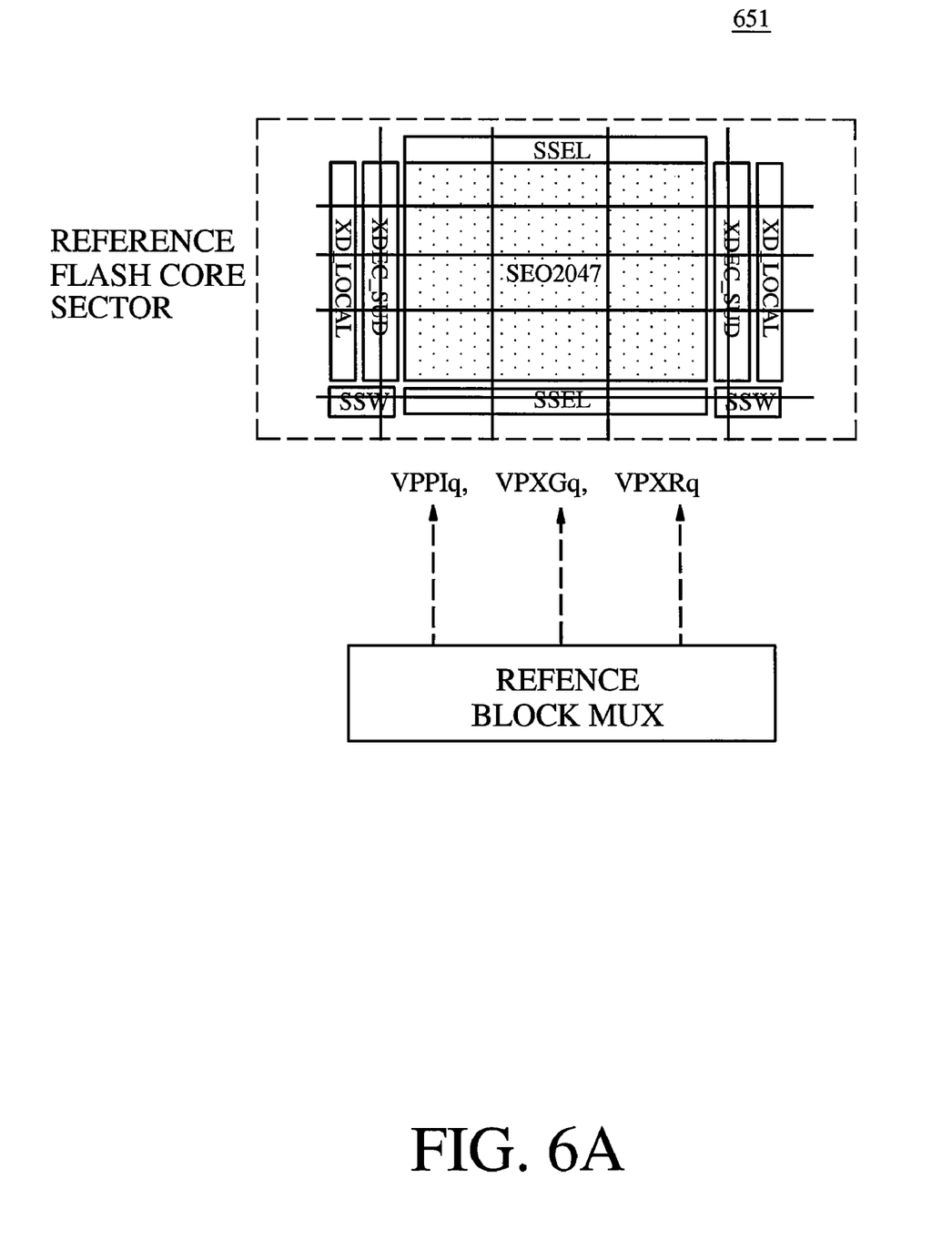
FIG. 6 shows a block diagram of an embodiment of a portion of the flash memory of FIG. 5.
Figure 6B:
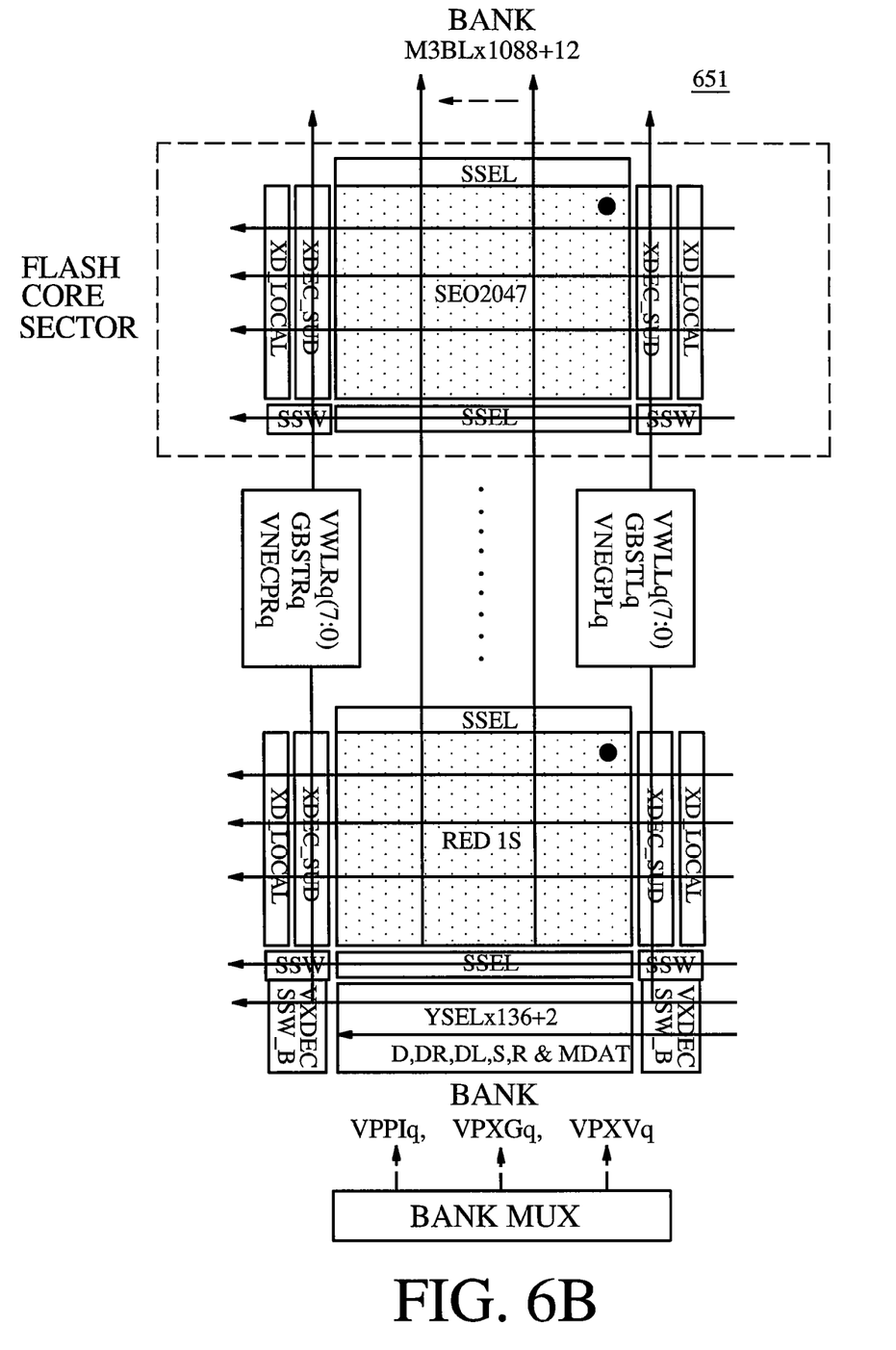

FIG. 6 shows a block diagram of an embodiment of a portion (651) of an embodiment of flash memory 550 of FIG. 5.

As shown in FIG. 6, in one particular embodiment, each bank of core memory cells 560 has 64 core sectors in vertical, and each core sector includes 512 word lines. However, the invention is not so limited, and the core cells may be arranged differently in different embodiments. During a read operation, data is read only from the selected memory location to be read, and the regulated voltages are provided only to the selected location. As shown, the sector includes surrounding periphery blocks, which operate as multiplexing circuit to pass the regulated voltages only to the selected location.

Figure 7:
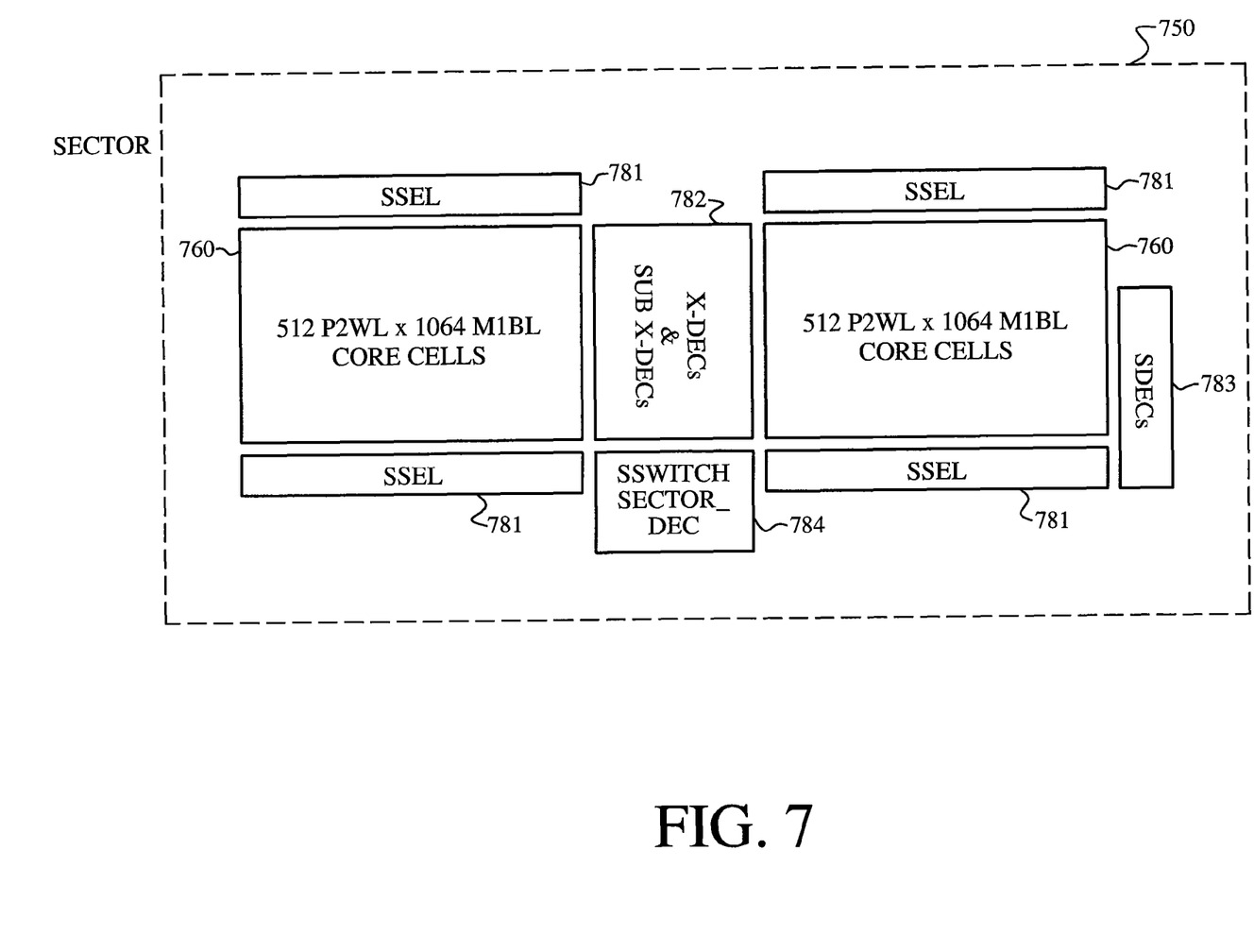
FIG. 7 illustrates a block diagram of an embodiment of the flash memory of FIG. 5.
Figure 8:
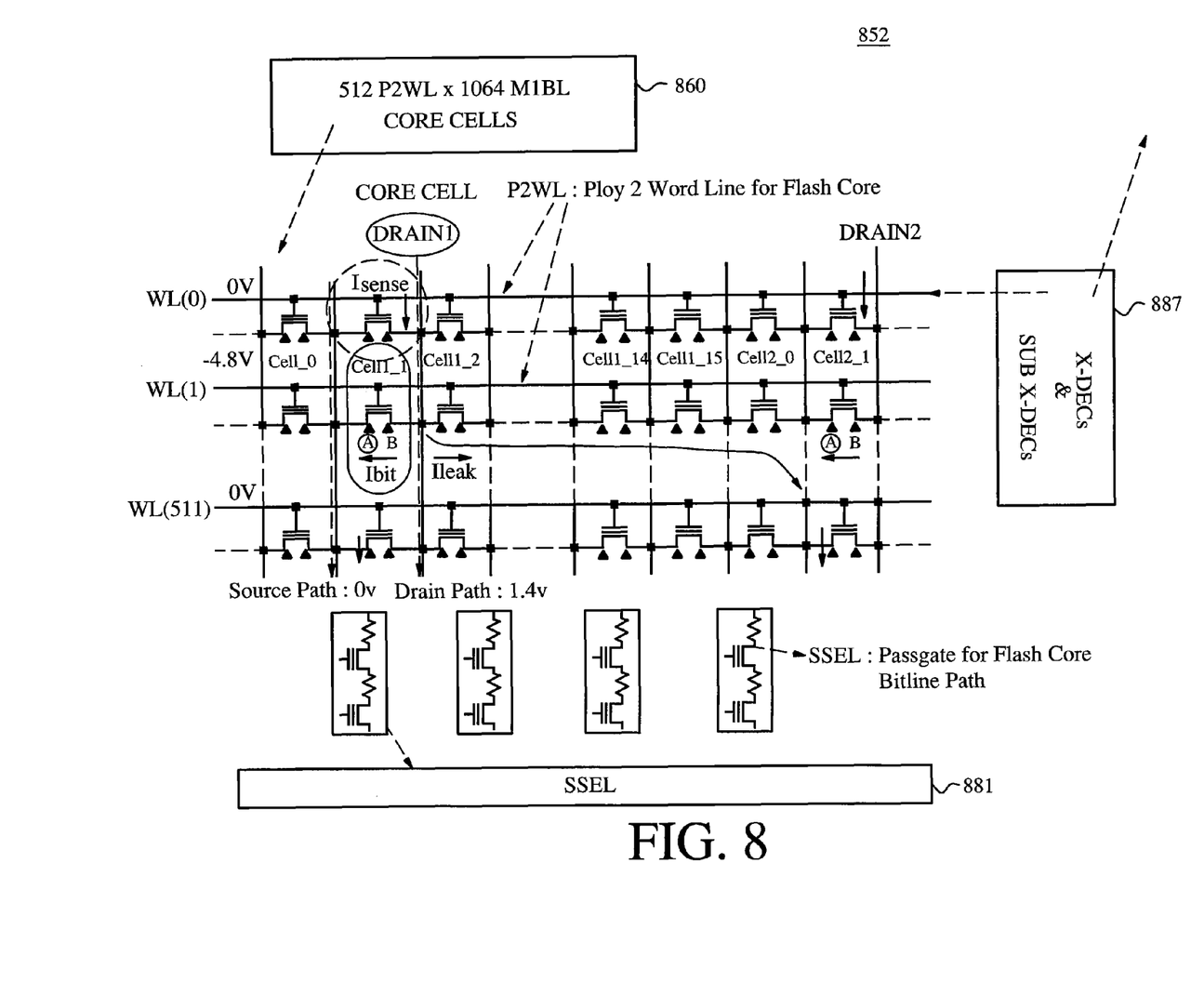
FIG. 8 shows a block diagram of an embodiment of a portion of the flash memory of FIG. 7.

FIG. 7 illustrates a block diagram of an embodiment of flash memory sector 750, which may be employed as an embodiment of one sector of flash memory 550 of FIG. 5. FIG. 8 shows a block diagram of an embodiment of a portion (852) of flash memory sector 750 of FIG. 7, which shows the core cells and pass gates for a particular embodiment of flash memory sector 750 in greater detail.

Flash memory sector 750 includes core cells 760, sector select (SSEL) 781, decoders and sub-decoders 782, sub-decoders 783, and switch sector decoders 784.

SSEL 781 includes pass line transistors for the core bit line path. These transistors provide a path to the sense amplifiers for the particular bit lines that are being addressed when a read command occurs. SSEL 781 is a core cell decoder that also receives sector decoding information and generates core cell decoding outputs. Decoders and sub-decoders 782 is a word line decoder. Sub-decoders 783 and switch sectors decoders 784 operate together as a sector decoder.

Voltage VPXVq is the supply voltage for the word line voltages (P2WL) provided to core cells 760. Voltages VPXGq are the supply voltages for decoders and sub-decoders 782. Voltage VPPIq is the supply voltage for pass line transistors SSEL. Voltages VPXRq are the supply voltages for word line voltages (P2WL) for the reference sector.

A variety of simulation and/or software tools may be employed to create a specific implementation of the memory. High-level software code, such as a register transfer logic (RTL) file, may be created and then compiled to form a netlist file. A physical design process may be employed in conjunction with the netlist file and a component library to create a layout file. The layout file may be used to create a mask file that may be provided to a device foundry to equip the foundry for manufacturing the memory.

Figure 9:
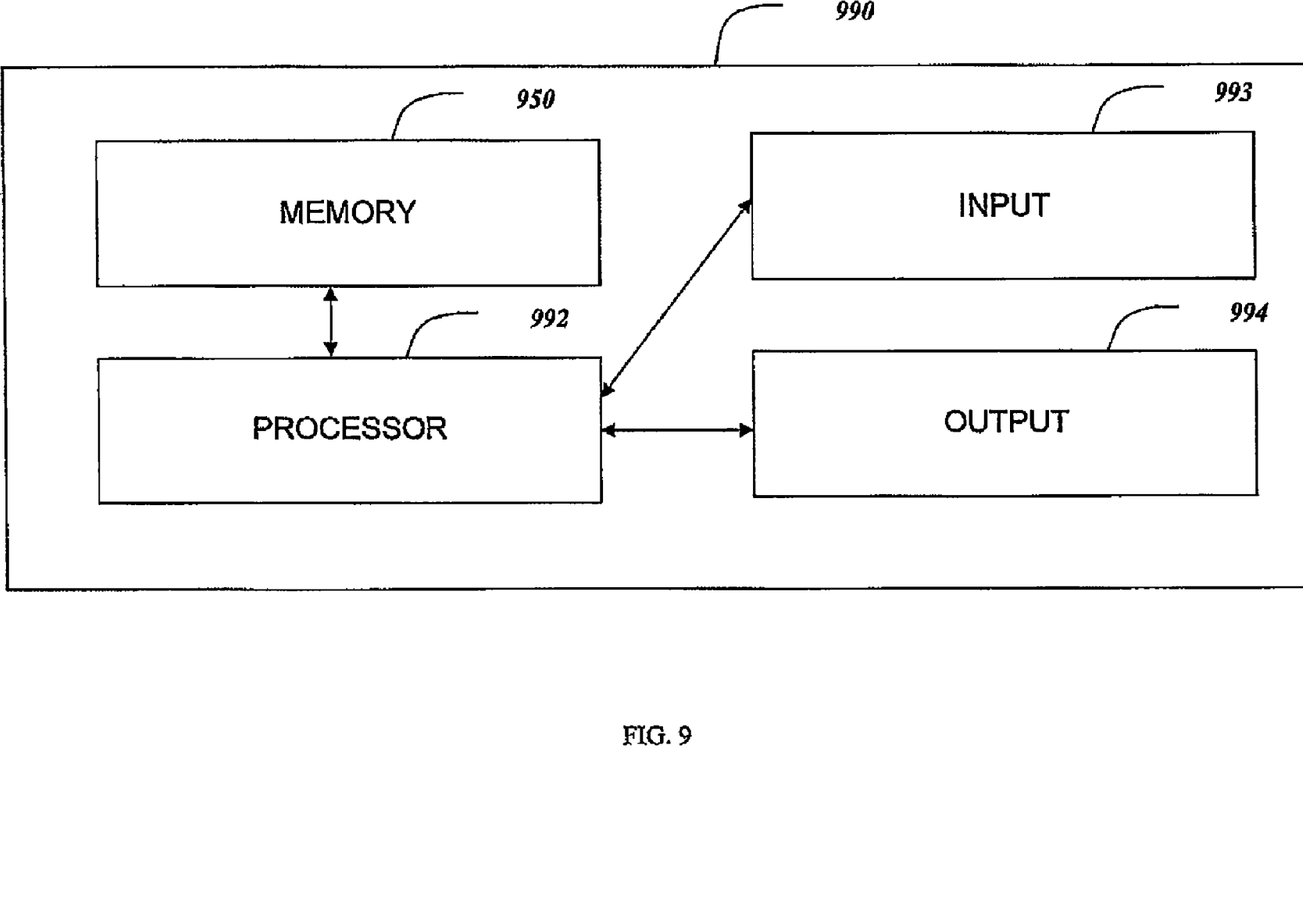
FIG. 9 illustrates block diagram of a system that includes an embodiment of the flash memory of FIG. 5, arranged in accordance with aspects of the invention.

Embodiments of memory 550 of FIG. 5 can be incorporated into any of a variety of components and/or systems, including for example, a processor and other components or systems of such components. FIG. 9 shows one embodiment of system 990, which may incorporate flash memory 950, which is an embodiment of flash memory 550 of FIG. 5. Memory 1401 can be directly or indirectly to any one of processor 992, input devices 993, and/or output devices 994. In one embodiment memory 950 may be configured such that it is removable from system 990. In another embodiment, memory 950 may be permanently connected to the components or a portion of the components of system 990.

In many embodiments, memory 950, processor 992, input devices 993, and/or output devices 994 of system 990 are configured in combination to function as part of a larger system. For example, system 990 may be incorporated into a cell phone, a handheld device, a laptop computer, a personal computer, and/or a server device. In addition or alternatively, system 990 can perform any of a variety of processing, controller, and/or data storage functions, such as those associated with sensing, imaging, computing, or other functions. Accordingly, system 990 can be incorporated into any of a wide variety of devices that may employ such functions (e.g., a digital camera, an MP3 player, a GPS unit, and so on).

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A circuit for flash memory voltage regulation, comprising:
    a resistor ladder that is arranged to provide a plurality of resistor ladder output voltages;

a first multiplexer that is arranged to provide a coarse reference voltage by selecting one of the plurality of resistor ladder output voltages based on a coarse adjustment signal;

a first fine series regulator controller that is arranged to control regulation an output voltage employing the coarse reference voltage as a reference voltage for the regulation of the output voltage, such that a value of the regulated output voltage is based in part on the coarse reference voltage, and further based in part on a fine adjustment signal, wherein the fine series regulator controller includes an error amplifier having at least a first input that is arranged to receive the coarse reference voltage, and a second input;

a first resistor circuit that is coupled between the output node and the second input of the error amplifier; and a first current source that is arranged to provide a first current to the first resistor circuit, such that the first current is proportional to the fine adjustment signal.

2. The circuit of claim 1, further comprising:

a coarse series regulator controller, wherein the resistor ladder is coupled between a top resistor ladder voltage and a bottom resistor ladder voltage, the coarse series regulator controller is arranged to control regulation of the top resistor ladder voltage, and wherein the coarse series regulator controller is arranged to receive one of the resistor ladder output voltages as a feedback voltage for the series regulation of the top resistor ladder voltage.

3. The circuit of claim 1, wherein the first resistor circuit consists of a plurality of resistors coupled in series with each other.

4. The circuit of claim 1, further comprising:

a plurality of charge pumps, wherein each of the plurality of charge pumps has an output, each of the plurality of outputs of the charge pumps are coupled together at a charge pump output node, and wherein the first fine series regulator controller has a power supply input that is coupled to the charge pump output node.

5. The circuit of claim 1, wherein the resistor ladder includes means for providing the plurality of resistor ladder output voltages such that the plurality of resistor ladder output voltages are evenly spaced from each other; or the first resistor circuit includes means for providing a fixed resistance across it.

6. The circuit of claim 1, further comprising:

a second multiplexer that is arranged to provide a second coarse reference voltage by selecting one of the plurality of resistor ladder output voltage based on a second coarse adjustment signal;

a second fine series regulator controller that is arranged to control regulation a second output voltage employing the second coarse reference voltage as a reference voltage for the regulation of the second output voltage, such that a value of the regulated second output voltage is based in part on the second coarse reference voltage, and further based in part on a second fine adjustment signal, wherein the second fine series regulator controller includes a second error amplifier having at least a first input that is arranged to receive the coarse reference voltage, and a second input;

a second resistor circuit that is coupled between the output node and the second input of the second error amplifier; and a second current source that is arranged to provide a second current to the second resistor circuit, such that the second current is proportional to the second fine adjustment signal.

7. The circuit of claim 6, further comprising:

a plurality of flash memory core cells that are coupled to word lines and bit lines;

sense amplifiers; and a memory controller, including decoder circuitry, wherein the memory controller arranged to provide a word line voltage to at least one of the word lines of plurality of flash memory cores cells employing the output voltage as the supply voltage for the word line voltage, the decoder circuitry is arranged to provide selected bit lines of the plurality of flash memory cores cells to the sense amplifiers during a read operation, and wherein the decoder circuitry employs the second output voltage as a supply voltage for the decoding.

8. A method for flash memory voltage regulation, comprising:

providing a plurality of voltages, wherein the plurality of voltages are distinct from each other;

selecting one of the plurality of voltages as a first coarse reference voltage employing a first coarse adjustment signal to make the selection;

employing a first fine series regulator to regulate a first output voltage employing the first coarse reference signal as a reference voltage for the regulation of the first output voltage, such that a value of the regulated first output voltage is based in part on the first coarse reference voltage, and further based in part on a first fine adjustment signal;

providing a first voltage drop between the output voltage and an input of the first series regulator such that the first voltage drop is proportional to the first fine adjustment signal.

9. The method of claim 8, further comprising:

generating the plurality of voltages with a resistor ladder; and providing a top voltage of the resistor ladder by performing coarse series regulation to generate the top voltage of the resistor ladder and employing one of the plurality of voltages as the feedback voltage for the coarse series regulation.

10. The method of claim 8, further comprising:

selecting one of the plurality of voltages as a second coarse reference voltage employing a second coarse adjustment signal to make the selection;

employing a second fine series regulator to regulate a second output voltage employing the second coarse reference signal as a reference voltage for the regulation of the second output voltage, such that a value of the regulated second output voltage is based in part on the second coarse reference voltage, and further based in part on a fine adjustment signal;

providing a second voltage drop between the second output voltage and an input of the second series regulator such that the second voltage drop is proportional to the second fine adjustment signal.

* * * * *

UNITED STATES PATENT AND TRADEMARK OFFICE
CERTIFICATE OF CORRECTION

| | | |
|---|---|---|
| PATENT NO. | : 7,848,167 B2 | Page 1 of 1 |
| APPLICATION NO. | : 12/255622 | |
| DATED | : December 7, 2010 | |
| INVENTOR(S) | : Soo-yong Park et al. | |

It is certified that error appears in the above-identified patent and that said Letters Patent is hereby corrected as shown below:

On sheet 6 of 10, in Figure 6A, line 7, delete "REFENCE" and insert -- REFERENCE --, therefor.

In column 6, line 40, delete "embodiment" and insert -- embodiment, --, therefor.

Signed and Sealed this
Twenty-sixth Day of April, 2011

David J. Kappos
*Director of the United States Patent and Trademark Office*